United States Patent
Ikeda et al.

(10) Patent No.: US 11,276,663 B2
(45) Date of Patent: Mar. 15, 2022

(54) ELECTRONIC MODULE

(71) Applicant: SHINDENGEN ELECTRIC MANUFACTURING CO., LTD., Tokyo (JP)

(72) Inventors: Kosuke Ikeda, Saitama (JP); Osamu Matsuzaki, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 14 days.

(21) Appl. No.: 16/614,316

(22) PCT Filed: May 19, 2017

(86) PCT No.: PCT/JP2017/018829
§ 371 (c)(1),
(2) Date: Nov. 15, 2019

(87) PCT Pub. No.: WO2018/211685
PCT Pub. Date: Nov. 22, 2018

(65) Prior Publication Data
US 2020/0161270 A1  May 21, 2020

(51) Int. Cl.
*H01L 23/00* (2006.01)
*H01L 23/492* (2006.01)
(Continued)

(52) U.S. Cl.
CPC ............ *H01L 24/37* (2013.01); *H01L 23/367* (2013.01); *H01L 23/492* (2013.01);
(Continued)

(58) Field of Classification Search
None
See application file for complete search history.

(56) References Cited

U.S. PATENT DOCUMENTS

| 9,048,338 B2 * | 6/2015 | Hosseini ........... H01L 23/49575 |
| 2002/0006685 A1 * | 1/2002 | Petitbon .................. H01L 24/81 |
| | | 438/611 |

(Continued)

FOREIGN PATENT DOCUMENTS

| EP | 2506300 A2 | 10/2012 |
| JP | 6373946 U | 5/1988 |

(Continued)

OTHER PUBLICATIONS

International Search Report in the international application No. PCT/JP2017/018829, dated Aug. 1, 2017.

(Continued)

*Primary Examiner* — Michelle Mandala
*Assistant Examiner* — Jordan M Klein
(74) *Attorney, Agent, or Firm* — Ladas & Parry, LLP

(57) ABSTRACT

An electronic module has a first substrate 11, a first conductor layer 12 that is provided on one side of the first substrate 11, a first electronic element 13 that is provided on one side of the first conductor layer 12, a second electronic element 23 that is provided on one side of the first electronic element 23, and a second connecting body 70 that has a second head part 71 provided on one side of the second electronic element 23 and an extending part 75 extending from the second head part 71 to the other side and abutting against the first substrate 11 or the first conductor layer 12.

7 Claims, 12 Drawing Sheets

(51) Int. Cl.
  *H01L 23/495* (2006.01)
  *H01L 25/07* (2006.01)
  *H01L 23/367* (2006.01)
  *H01L 23/538* (2006.01)
(52) U.S. Cl.
  CPC .. *H01L 23/49537* (2013.01); *H01L 23/49541* (2013.01); *H01L 23/5385* (2013.01); *H01L 24/32* (2013.01); *H01L 24/40* (2013.01); *H01L 25/074* (2013.01); *H01L 2224/291* (2013.01); *H01L 2224/32245* (2013.01); *H01L 2224/73215* (2013.01); *H01L 2224/73265* (2013.01); *H01L 2924/13091* (2013.01)

(56) References Cited

U.S. PATENT DOCUMENTS

| | | |
|---|---|---|
| 2009/0194856 A1 | 8/2009 | Gomez |
| 2010/0193921 A1 | 8/2010 | Jereza et al. |
| 2010/0265024 A1 | 10/2010 | Nakashiba |
| 2011/0298114 A1* | 12/2011 | Pruitt ............... H01L 21/50 257/676 |
| 2012/0063107 A1* | 3/2012 | Krishnan ............ H01L 24/73 361/783 |
| 2012/0200281 A1* | 8/2012 | Herbsommer .... H01L 23/49575 323/311 |
| 2015/0206864 A1* | 7/2015 | Harazono ........... H01L 29/7827 257/329 |
| 2016/0099224 A1 | 4/2016 | Yoshimatsu et al. |
| 2016/0254250 A1 | 9/2016 | Ikeda et al. |

FOREIGN PATENT DOCUMENTS

| | | |
|---|---|---|
| JP | 2002093977 A | 3/2002 |
| JP | 2003318208 A | 11/2003 |
| JP | 2010245212 A | 10/2010 |
| JP | 2011142172 A | 7/2011 |
| JP | 2012248658 A | 12/2012 |
| JP | 2014045157 A | 3/2014 |
| JP | 2014060325 A | 4/2014 |
| JP | 2014511027 A | 5/2014 |
| JP | 2016072575 A | 5/2016 |
| WO | 2009032537 A1 | 3/2009 |
| WO | 2011156051 A1 | 12/2011 |
| WO | 2012109265 A2 | 8/2012 |

OTHER PUBLICATIONS

Written Opinion of the International Search Authority in the international application No. PCT/JP2017/018829, dated Aug. 1, 2017 and English translation provided by Google Translate.

Search Report and Written Opinion of the Netherlands Patent Office in international application No. PCT/JP2017/018829, dated Nov. 29, 2018 and English translation provided by Google Translate.

International Preliminary Report on Patentability in the international application No. PCT/JP2017/018829, dated May 19, 2017 and English translation provided by Google Translate.

Japanese Office Action in Japanese patent application No. 2018-538251.

* cited by examiner

FIG.4
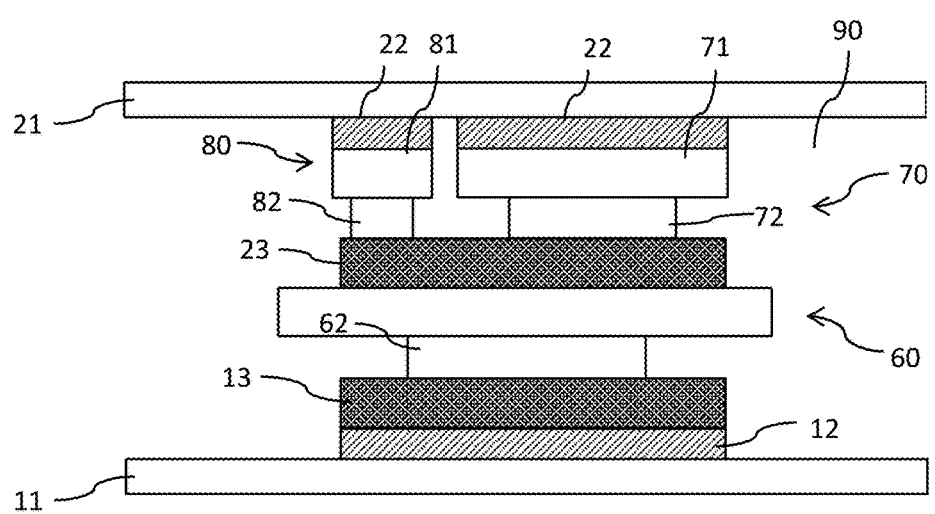
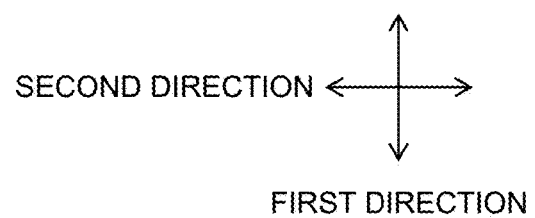

FIG.6
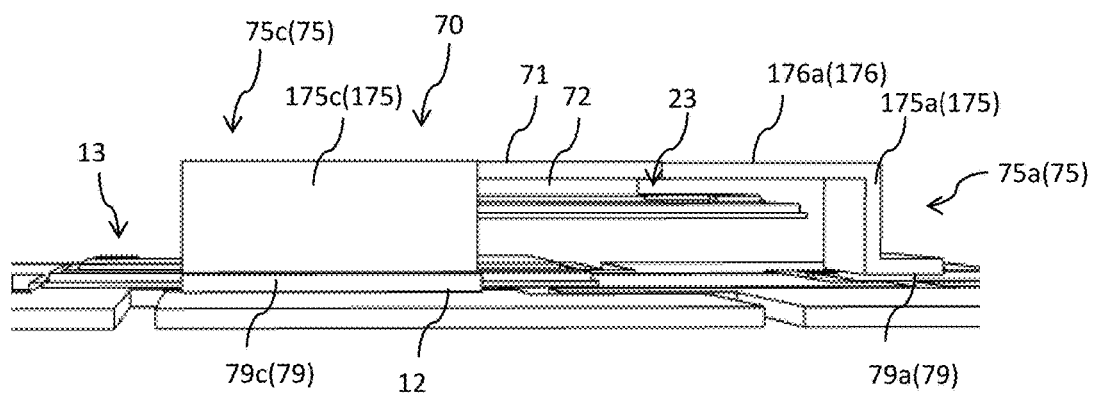
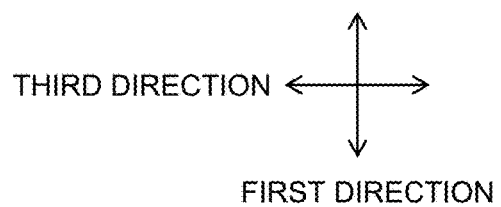

ELECTRONIC MODULE

CROSS-REFERENCE TO RELATED APPLICATION

The present application is the U.S. national phase of PCT Application PCT/JP2017/018826 filed on May 19, 2017, the disclosure of which is incorporated herein by reference in its entirety.

TECHNICAL FIELD

The present invention relates to an electronic module.

BACKGROUND ART

An electronic module in which a plurality of electronic elements are provided in a sealing resin is conventionally known (for example, see JP 2014-45157 A). It is preferable to miniaturize such an electronic module.

As one method of miniaturizing the electronic module, it can be considered to adopt an aspect in which electronic elements are stacked in a layer shape. In this case, it can be considered to provide a connecting body on one side (for example, a front surface side) of the electronic element and provide another electronic element on one side of the connecting body.

When an aspect in which the electronic element is provided on the connecting body as described above is adopted, a first electronic element and a second electronic element are positioned close to each other, such that heat is easily confined, and it is thus necessary to improve heat dissipation properties.

SUMMARY OF INVENTION

Problem to be Resolved by the Invention

The present invention provides an electronic module capable of providing high heat dissipation properties even when an aspect in which a first electronic element and a second electronic element are stacked is adopted.

Solution to Problem

Means of Solving the Problem

An electronic module may comprise:
a first substrate;
a first conductor layer that is provided on one side of the first substrate;
a first electronic element that is provided on one side of the first conductor layer;
a second electronic element that is provided on one side of the first electronic element; and
a second connecting body that has a second head part provided on one side of the second electronic element and an extending part extending from the second head part to the other side and abutting against the first substrate or the first conductor layer.

In the electronic module according to the present invention,
the second connecting body may have a plurality of extending parts.

In the electronic module according to the present invention,
the extending part may have a plane-direction extending part extending from the second head part in a plane direction and a height-direction extending part extending from the plane-direction extending part to the other side.

In the electronic module according to the present invention,
the extending part may have an extending base end part extending in a plane direction.

The electronic module, according to the present invention, may further comprise
a first connecting body that is provided on one side of the first electronic element and is provided on the other side of the second electronic element,
wherein the first connecting body may have a first head part, on one side of which the second electronic element is provided, and a support part extending from the first head part to the other side and abutting against the first substrate or the first conductor layer.

In the electronic module according to the present invention,
the second connecting body may have a plurality of extending parts, and
the first connecting body may have a plurality of support parts.

In the electronic module according to the present invention,
each of extending parts may have a plane-direction extending part,
each of support parts may have a plane-direction support part, and
the plane-direction extending part and the plane-direction support parts may not overlap with each other in a plane view.

An electronic module may comprise:
a first substrate;
a first electronic element that is provided on one side of the first substrate;
a second electronic element that is provided on one side of the first electronic element; and
a second connecting body that has a second head part provided on one side of the second electronic element and an extending part extending from the second head part to the other side and abutting against the first substrate,
wherein the first substrate is a metal substrate.

Advantageous Effects of Invention

As an aspect of the present invention, when a second connecting body, which has a second head part provided on one side of the second electronic element and an extending part extending from the second head part to the other side and abutting against the first substrate or the first conductor layer, is provided, heat from the second electronic element can be efficiently dissipated.

BRIEF DESCRIPTION OF DRAWINGS

FIG. 4 is a longitudinal cross-sectional view of the electronic module that can be used in the first embodiment of the present invention, taken along a cross section different from that of FIG. 1.

FIG. 6 is a side view of the electronic module that can be used in the second embodiment of the present invention.

DESCRIPTION OF EMBODIMENTS

First Embodiment

<<Configuration>>

Figure 1:
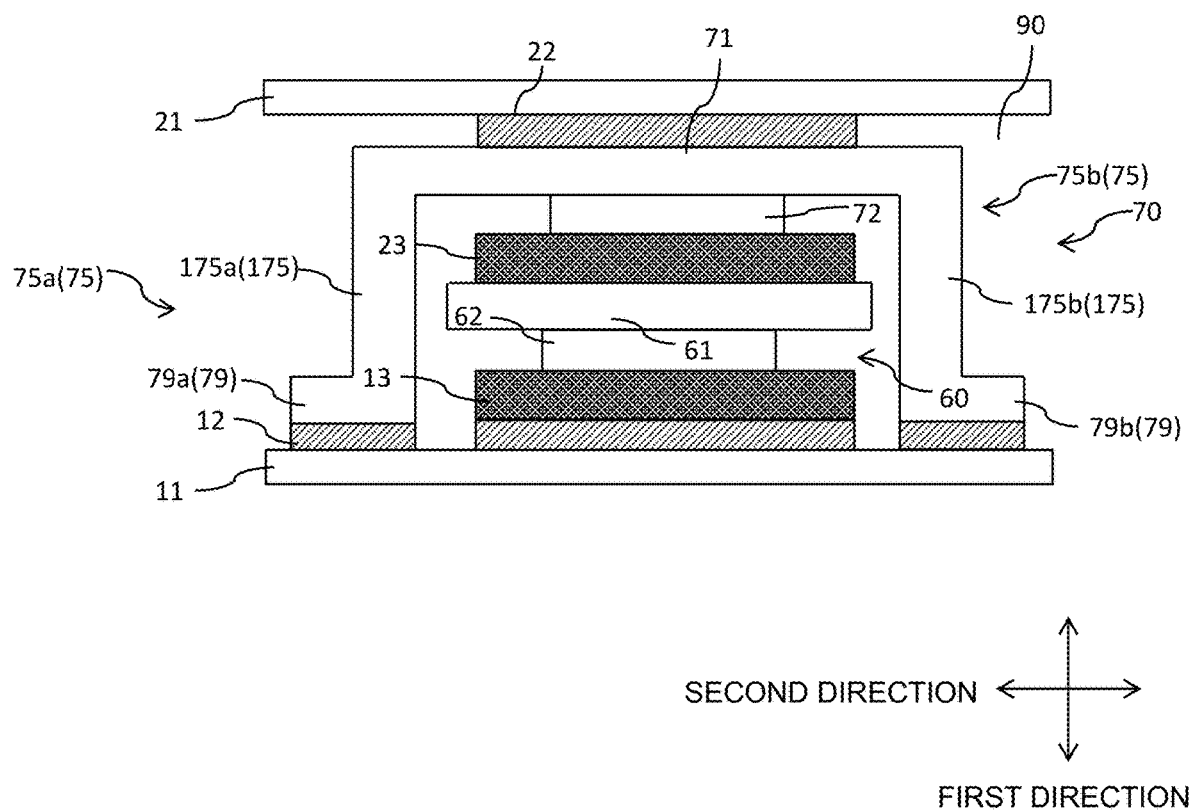
FIG. 1 is a longitudinal cross-sectional view of an electronic module that can be used in a first embodiment of the present invention.

In the present embodiment, "one side" refers to an upper side in FIG. 1, and "the other side" refers to a lower side in FIG. 1. Upward and downward directions in FIG. 1 are referred to as a "first direction", leftward and rightward directions in FIG. 1 are referred to as a "second direction", and frontward and rearward directions of a page are referred to as a "third direction". An in-plane direction including the second direction and the third direction is referred to as a "plane direction", and is referred to as a "plane view" when viewed from the upper side of FIG. 1.

An electronic module according to the present embodiment may have a first electronic unit and a second electronic unit.

As shown in FIG. 1, the first electronic unit may have a first substrate 11, a plurality of first conductor layers 12 provided on one side of the first substrate 11, and a first electronic element 13 provided on one side of the first conductor layer 12. The first electronic element 13 may be a switching element or may be a control element. When the first electronic element 13 is the switching element, the first electronic element 13 may be a metal oxide semiconductor field effect transistor (MOSFET). Each of the first electronic element 13 and a second electronic element 23 to be described below may be a semiconductor element, and a semiconductor material of the semiconductor element may be silicon, silicon carbide, gallium nitride, or the like. The other side surface of the first electronic element 13 may be connected to the first conductor layer 12 through a conductive adhesive such as solder.

A first connecting body 60 may be provided on one side of the first electronic element 13. The first connecting body 60 may be connected to one side surface of the first electronic element 13 through a conductive adhesive such as solder.

As shown in FIG. 1, the second electronic unit may be provided on one side of the first connecting body 60. The second electronic unit may have a second electronic element 23 provided on one side of the first connecting body 60. In addition, the second electronic unit may have a second substrate 21 and a second conductor layer 22 provided on the other side of the second substrate 21. A second connecting body 70 may be provided on the other side of the second conductor layer 22.

When the second conductor layer 22 is provided, the second electronic element 23 may be provided on the second conductor layer 22, different from an aspect shown in FIG. 1. The second connecting body 70 may be connected to one side surface of the second electronic element 23 and the other side surface of the second conductor layer 22 through a conductive adhesive such as solder.

The second electronic element 23 may be a switching element or may be a control element. When the second electronic element 23 is the switching element, the first electronic element 13 may be a MOSFET.

The first connecting body 60 may have a first head part 61 and a first pillar part 62 extending from the first head part 61 to the other side. The second connecting body 70 may have a second head part 71 and a second pillar part 72 extending from the second head part 71 to the other side.

The first connecting body 60 may have a substantially T-shaped cross section. The second connecting body 70 according to the present embodiment may have one or more extending parts 75 extending from the second head part 71 to the other side, or may have two extending parts 75 (75a and 75b) as shown in FIG. 1. Although an aspect in which the two extending parts 75 are provided is described in the present embodiment, the number of extending parts 75 is not limited thereto, but three extending parts 75 may be used as in a second embodiment to be described below or four or more extending parts 75 may be used.

The extending parts 75 may have extending base end parts 79 extending in a plane direction. When the extending parts 75 have a first extending part 75a and a second extending part 75b, the first extending part 75a may have a first extending base end part 79a, and the second extending part 75b may have a second extending base end part 79b.

Each of the extending parts 75 may abut against the first substrate 11 or the first conductor layer 12. As an example, each of the extending parts 75 may abut against the first conductor layer 12. The first conductor layer 12 connected to the extending part 75 may not be electrically connected to the other first conductor layers 12, the second conductor layer 22, the first electronic element 13, and the second electronic element 23.

The extending parts 75 shown in FIG. 1 have height-direction extending parts 175 (175a and 175b) extending in a height direction (a first direction), but do not have plane-direction extending parts 176 extending from the second head part 71 in the plane direction as described in a second embodiment.

The second head part 71 may have a substantially rectangular shape in a plane view. When any shape has four sides facing each other, it corresponds to the "substantially rectangular shape" in the present embodiment, and when any shape has right angle corner parts or has arcuate corner parts, it also corresponds to the "substantially rectangular shape".

Figure 2:
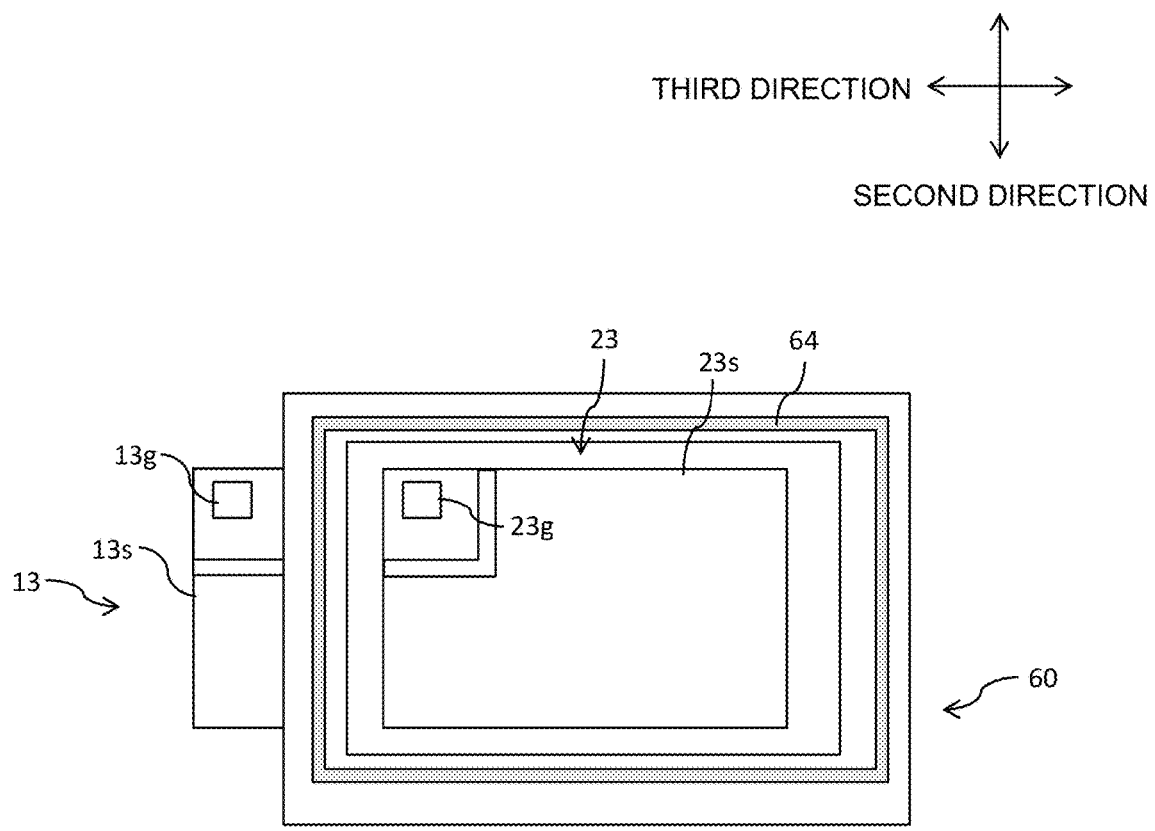
FIG. 2 is a plan view of the electronic module that can be used in the first embodiment of the present invention.
Figure 3:
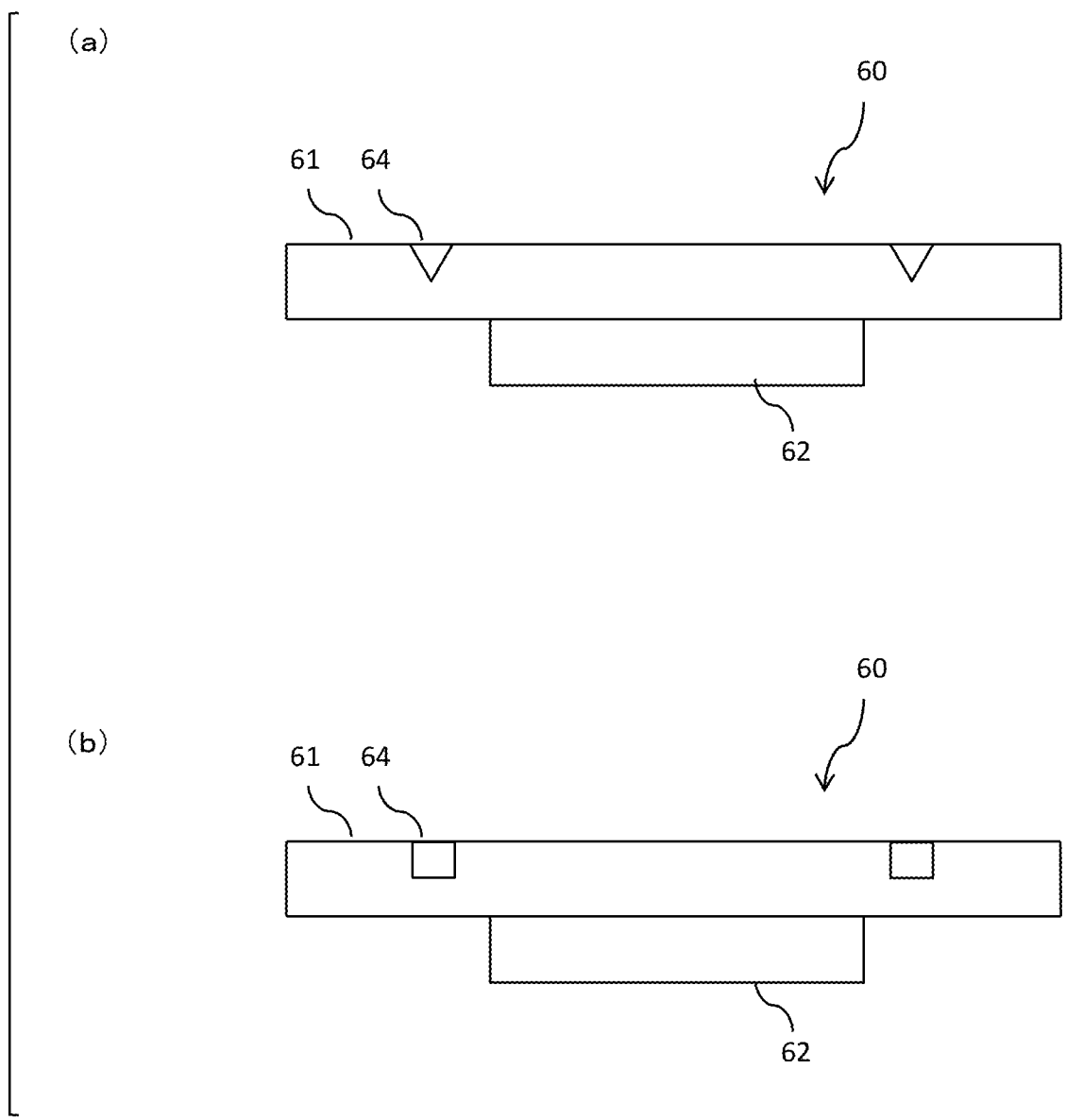
FIG. 3(a) is a longitudinal cross-sectional view of a first connecting body that can be used in the first embodiment of the present invention.
FIG. 3(b) is a longitudinal cross-sectional view of another first connecting body that can be used in the first embodiment of the present invention.

As shown in FIG. 2, a first groove part 64 may be provided in one side surface of the first head part 61. The first groove part 64 may be provided in at least a portion of a circumference of the first pillar part 62 or may be provided in the entirety of the circumference of the first pillar part 62, in a plane view. A cross section of the first groove part 64 may have a rectangular shape as shown in FIG. 3(b) or may have a triangular shape as shown in FIG. 3(a). The triangular shape may be a right-angled triangle or may be an isosceles triangle.

A second groove part (not shown) may also be provided in one side surface of the second head part 71. The second groove part may be provided in at least a portion of a circumference of the second pillar part 72 or may be provided in the entirety of the circumference of the second pillar part, in a plane view. A cross section of the second groove part may have a rectangular shape as shown in FIG. 3(b) or may have a triangular shape as shown in FIG. 3(a). The triangular shape may be a right-angled triangle or may be an isosceles triangle.

As shown in FIG. 4, a third connecting body 80 may be provided on one side of the second electronic element 23. The third connecting body 80 may have a third head part 81 and a third pillar part 82 extending from the third head part 81 to the other side. The third connecting body 80 may be connected to the other side surface of the second conductor layer 22 and one side surface of the second electronic element 23 through a conductive adhesive such as solder. FIG. 4 is a longitudinal cross-sectional view taken at a place at which the extending parts 75 is not provided, and the extending part 75 is not shown. Further, as the third connecting body 80, a general connector 85 (see FIG. 7) of which a longitudinal cross section having the third pillar part 82 does not have a substantially T shape may be used.

As shown in FIG. 2, in a plane view, the first electronic element 13 may have an aspect in which it is exposed externally from the second head part 71. When the first electronic element 13 is a switching element such as a metal oxide semiconductor field effect transistor (MOSFET), a first gate terminal 13g, or the like, may be provided on one side surface thereof. Similarly, when the second electronic element 23 is a switching element such as a MOSFET, a second gate terminal 23g, or the like, may be provided on one side surface thereof. The first electronic element 13 shown in FIG. 2 has the first gate terminal 13g and a first source terminal 13s provided on one side surface thereof, and the second electronic element 23 has the second gate terminal 23g and a second source terminal 23s provided on one side surface thereof. In this case, the second connecting body 70 may be connected to the second source terminal 23s of the second electronic element 23 through a conductive adhesive, and the third connecting body 80 may be connected to the second gate terminal 23g of the second electronic element 23 through a conductive adhesive. In addition, the first connecting body 60 may be connected to the first source terminal 13s of the first electronic element 13 and a second drain terminal provided on the other side of the second electronic element 23 through a conductive adhesive. A first drain terminal provided on the other side of the first electronic element 13 may be connected to the first conductor layer 12 through a conductive adhesive. The first gate terminal 13g of the first electronic element 13 may be connected to a fourth connecting body (for example, a connector) through a conductive adhesive, and the fourth connecting body may be connected to the first conductor layer 12 through a conductive adhesive.

When only any one of the first electronic element 13 and the second electronic element 23 is a switching element, it can be considered that the second electronic element 23 mounted on the first connecting body 60 is used as a control element with a low heat generation property and the first electronic element 13 is used as the switching element. Conversely, it can also be considered that the second electronic element 23 mounted on the first connecting body 60 is used as the switching element and the first electronic element 13 is used as a control element with a low heat generation property.

The electronic module may have a sealing part 90 sealing the first electronic element 13, the second electronic element 23, the first connecting body 60, the second connecting body 70, the third connecting body 80, the first conductor layer 12, and the second conductor layer 22 and formed of a sealing resin, or the like.

The first conductor layer 12 may be connected to a terminal part (not shown), and a tip side of the terminal part may be exposed to the outside of the sealing part 90 to be connectable to an external apparatus.

In addition, a chip module may be configured by the first electronic element 13, the second electronic element 23, the first connecting body 60, the second connecting body 70, the third connecting body 80, and the fourth connecting body. In this case, the electronic module may be manufactured by disposing the chip module having the first electronic element 13, the second electronic element 23, the first connecting body 60, the second connecting body 70, the third connecting body 80, and the fourth connecting body between the first substrate 11 on which the first conductor layer 12 is provided and the second substrate 21 on which the second conductor layer 22 is provided and then sealing the chip module by the sealing part 90.

As each of the first substrate 11 and the second substrate 21, a ceramic substrate, an insulating resin layer, or the like, can be adopted. As the conductive adhesive, in addition to the solder, a material containing Ag or Cu as a main component can be used. As a material of each of the first connecting body 60 and the second connecting body 70, a metal such as Cu, can be used. As each of the substrates 11 and 21, for example, a metal substrate subjected to circuit patterning can be used. In this case, the substrates 11 and 21 also serve as the conductor layers 12 and 22, respectively.

The terminal part and the conductor layers 12 and 22 are not limited to an aspect in which they are bonded to each other using the conductive adhesive such as the solder, but may be bonded to each other by laser welding or ultrasonic bonding.

<<Acting Effect>>

Next, an example of an acting effect according to the present embodiment having the abovementioned configuration will be described. It should to be noted that all the aspects described in the "acting effect" can be adopted in the above configuration.

When the extending part 75 is adopted as in the present embodiment, heat from the second electronic element 23 can be efficiently dissipated, such that a high heat dissipation effect can be realized.

When an aspect in which the two or more extending parts 75 are provided is adopted, a higher heat dissipation effect can be realized by the second connecting body 70.

By adopting an aspect according to the present embodiment, a repulsive force pushing the second substrate 21 back to one side can be given by the second connecting body 70. That is, by applying heat in a manufacturing process, or the like, a force allowing the first substrate 11 and the second substrate 21 to be bent backward or distorted is applied to the first substrate 11 and the second substrate 21, but it is useful with regard to allowing the first substrate and the second substrate to be prevented from being bent backward or distorted by using the second connecting body 70 having a plurality of extending parts 75.

The second head part 71 of the second connecting body 70 may be provided to stride across the second electronic element 23. As shown in FIG. 1, the extending parts 75 may have the first extending part 75a extending from one of the circumferential parts of the second head part 71 and the second extending part 75b extending from another circumferential part of the head part. When this aspect is adopted, it is useful with regard to allowing the second connecting body 70 to be disposed on the first substrate 11 or the first conductor layer 12 in a more balanced manner.

When the extending parts 75 have the extending base end parts 79 extending in the plane direction, the second connecting body 70 can be disposed on the first substrate 11 or the first conductor layer 12 in a more balanced manner, and a contact area between the second connecting body 70 and the first substrate 11 or the first conductor layer 12 can be increased by the extending base end parts 79, such that a heat dissipation effect can be improved.

When an aspect in which the second connecting body 70 has the second pillar part 72 extending from the second head part 71 to the other side is adopted, a space can be provided on one side of the second electronic element 23, such that it is possible to prevent heat generated from the second electronic element 23 from being confined. Similarly, as shown in FIG. 4 when an aspect in which the third connecting body 80 has the third pillar part 82 extending from the third head part 81 to the other side is adopted, a space can be provided on one side of the second electronic element 23, such that it is possible to prevent the heat generated from the second electronic element 23 from being confined.

As shown in FIG. 1, when an aspect in which the first connecting body 60 has the first pillar part 62 is adopted, it is useful with regard to allowing the first electronic element 13 and the second electronic element 23 to be spaced apart from each other by a predetermined interval, and allowing heat to be released.

In addition, when each of the first electronic element 13 and the second electronic element 23 is the switching element, heat is easily confined, but when an aspect in which the plurality of extending parts 75 abut against the first substrate 11 or the first conductor layer 12 is adopted, it is useful with regard to allowing the heat to be efficiently released.

Second Embodiment

Next, a second embodiment of the present invention will be described.

Figure 5:
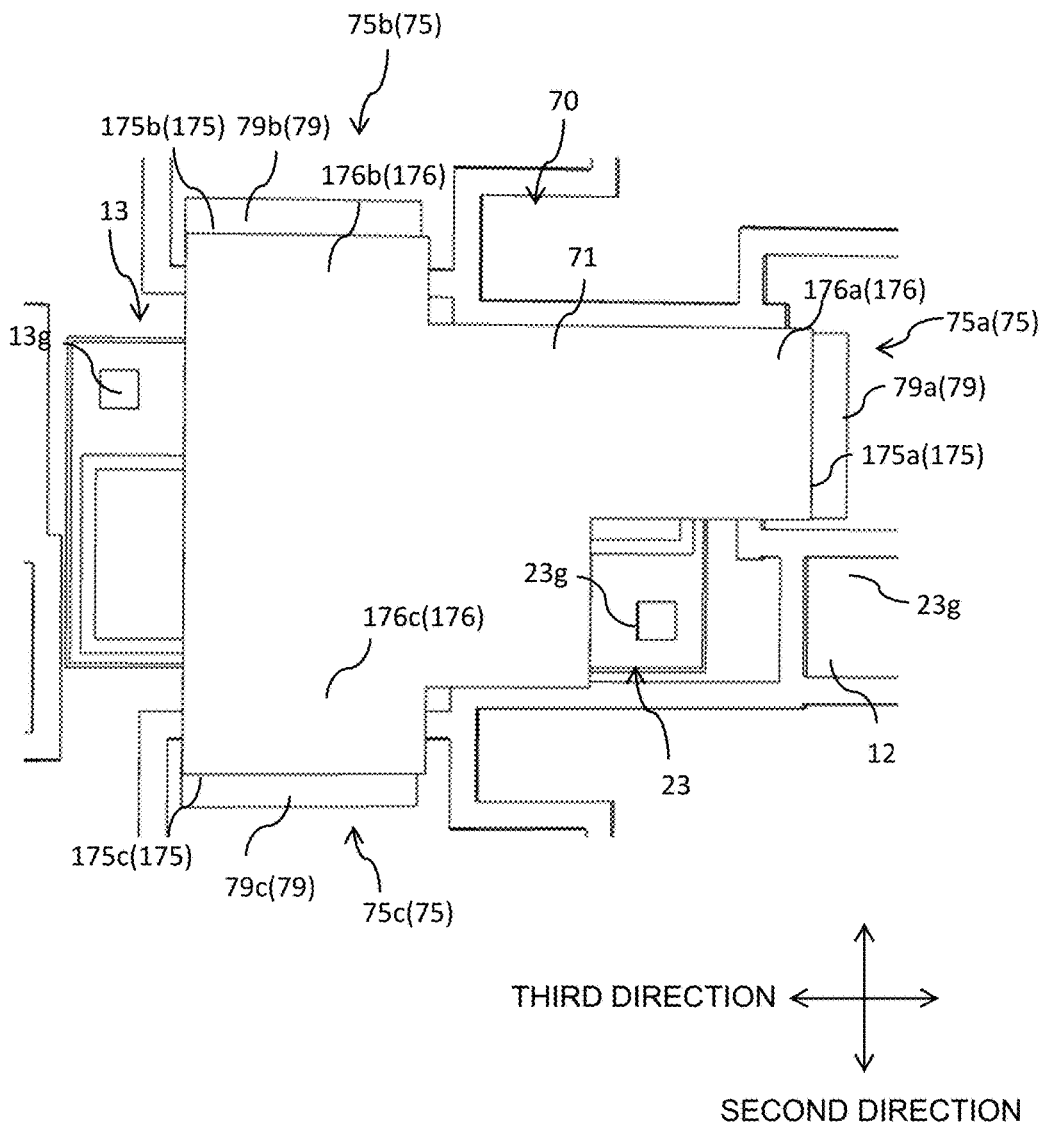
FIG. 5 is a plan view of an electronic module that can be used in a second embodiment of the present invention.

In the first embodiment, the aspect in which the two extending parts 75 are provided is described, but in the second embodiment, as shown in FIGS. 5 and 6, an aspect in which three extending parts 75 (75a to 75c) are provided is described. In addition, the extending parts 75 have plane-direction extending parts 176 (176a to 176c) extending from a second head part 71 in a plane direction and height-direction extending parts 175 (175a to 175c) extending from the plane-direction extending parts 176 in a height direction (a first direction). Other configurations are the same as those in the first embodiment, and all the aspects described in the first embodiment can be adopted. The members described in the first embodiment will be described using the same reference numerals.

It should be noted that the plane-direction extending part 176 means a part of which a size in a width direction is smaller than that of the second head part 71.

As shown in FIGS. 5 and 6, in the present embodiment, a first extending part 75a has a first plane-direction extending part 176a and a first height-direction extending part 175a, a second extending part 75b has a second plane-direction extending part 176b and a second height-direction extending part 175b, and a third extending part 75c has a third plane-direction extending part 176c and a third height-direction extending part 175c.

In the present embodiment, the three extending parts 75 are provided, and a higher heat dissipation effect can thus be realized as compared with an aspect in which one extending part 75 is provided or two extending parts 75 are provided.

In addition, by adopting the three extending parts 75, it is useful with regard to allowing a repulsive force pushing a second substrate 21 back to one side to act stronger and in a more balanced manner by a second connecting body 70.

Third Embodiment

Next, a third embodiment of the present invention will be described.

Figure 7:
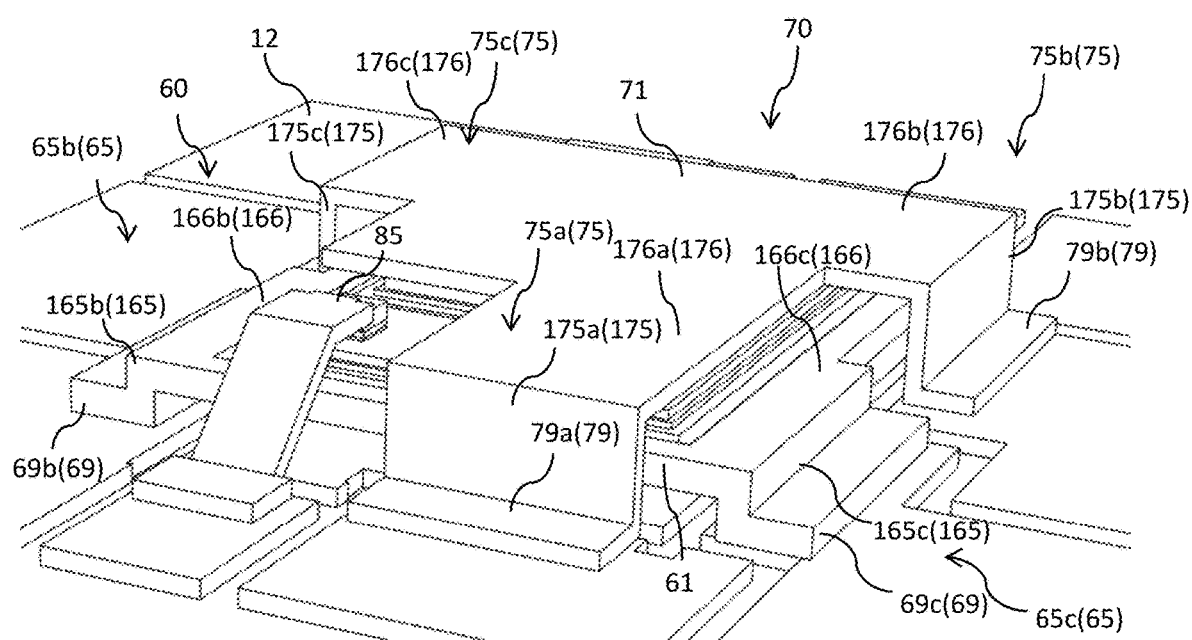
FIG. 7 is a perspective view of an electronic module that can be used in a third embodiment of the present invention.
Figure 8:
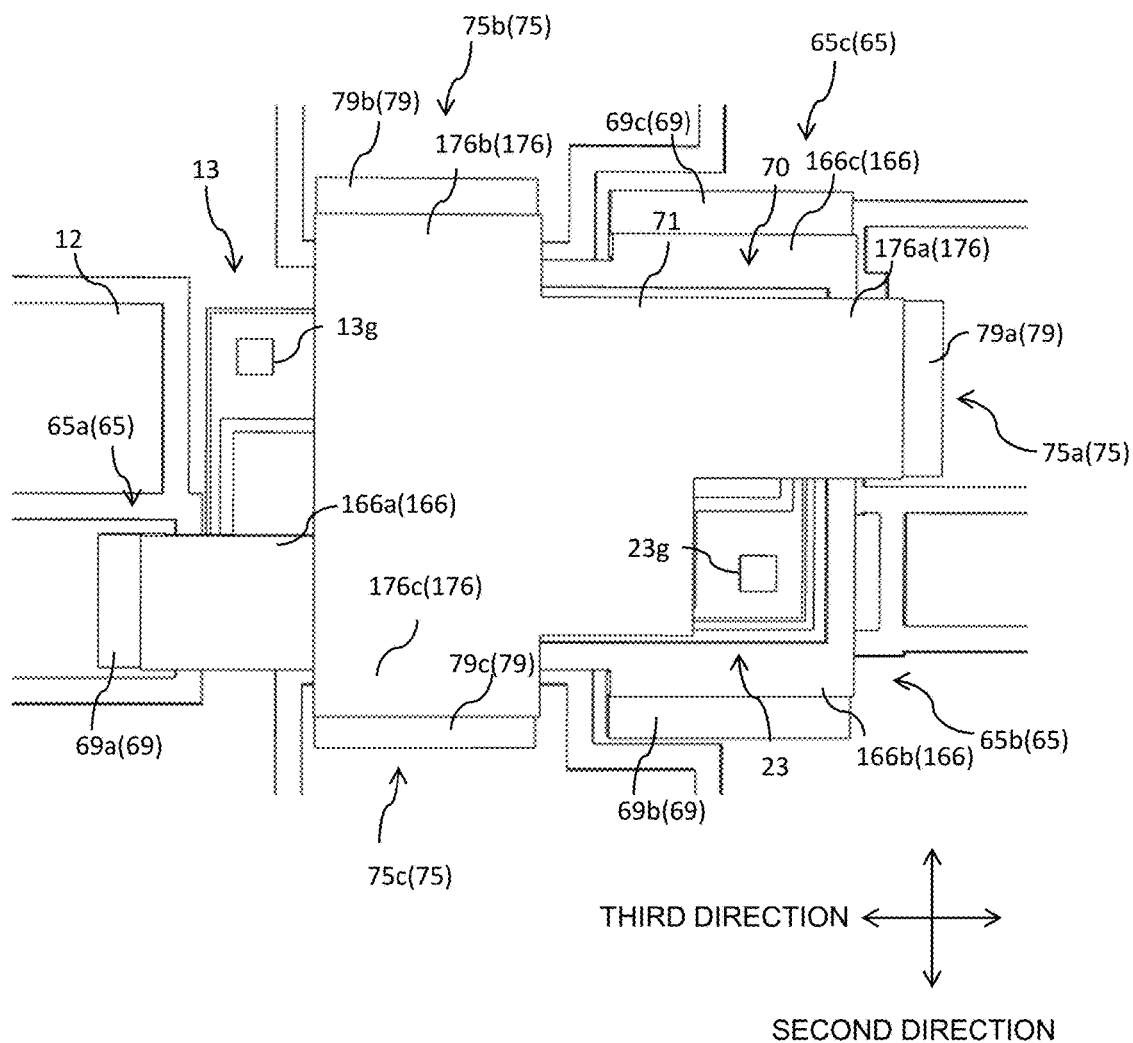
FIG. 8 is a plan view of the electronic module that can be used in the third embodiment of the present invention.
Figure 9:
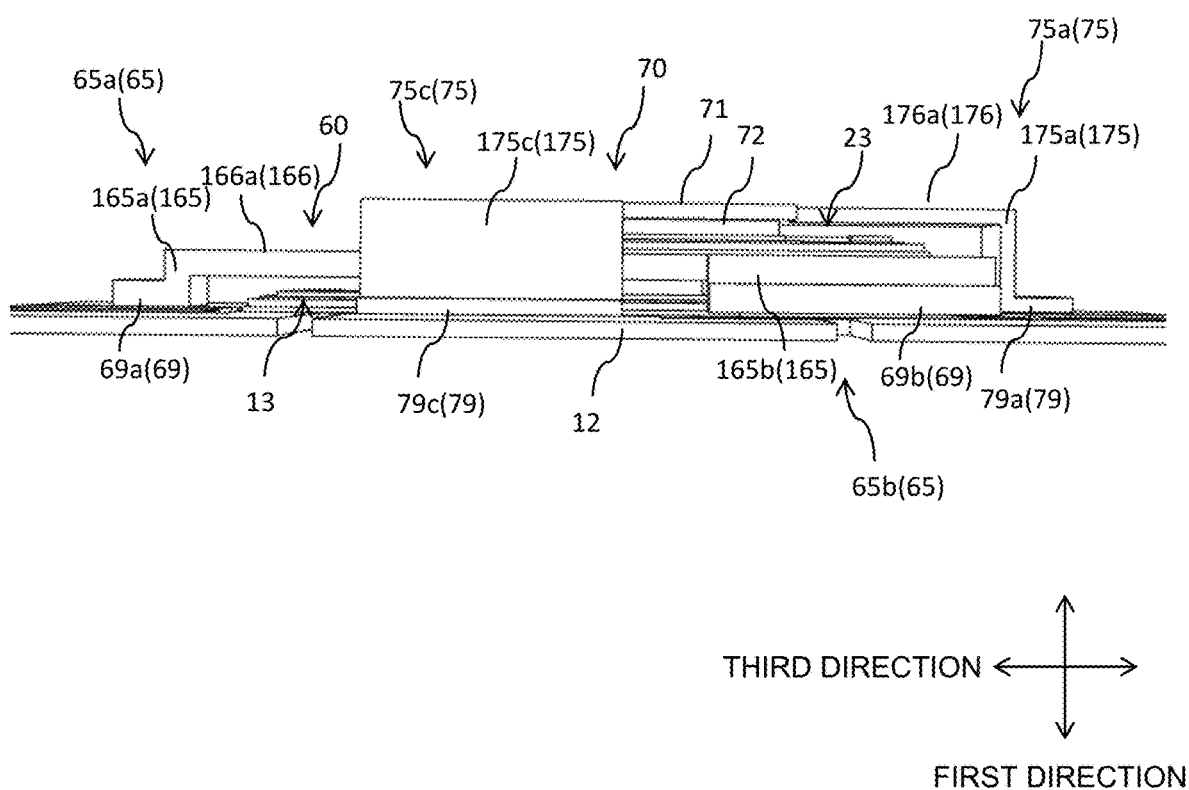
FIG. 9 is a side view of the electronic module that can be used in the third embodiment of the present invention.

In the first embodiment, the first connecting body 60 having the substantially T-shaped cross section is used, but a first connecting body 60 according to the present embodiment has a first head part 61 and three support parts 65 (65a to 65c) extending from the first head part 61 to the other side, as shown in FIGS. 7 to 9. The supports 65 are configured to abut against a first conductor layer 12 or a first substrate 11. In other configurations, all the aspects described in the above respective embodiments can be adopted. The members described in the above respective embodiments will be described using the same reference numerals.

The support parts 65 may have, respectively, support base end parts 69 (69a to 69c) extending in a plane direction and abutting against a first substrate 11 or a first conductor layer 12. Alternatively, the support base end parts 69 need not to be provided in a plurality of support parts 65, respectively, and the support base end parts 69 may be provided in some of the plurality of support parts 65 and may not be provided in the others of the plurality of support parts 65.

When the support base end parts 69 as described above are provided, the first connecting body 60 can be disposed on the first substrate 11 or the first conductor layer 12 in a more balanced manner, and a contact area between the first connecting body 60 and the first substrate 11 or the first conductor layer 12 can be increased by the support base end parts 69, such that a heat dissipation effect can be improved.

Each of the support parts 65 may abut against the first substrate 11 or the first conductor layer 12. As an example, each of the support parts 65 may abut against the first conductor layer 12. When an aspect in which the first conductor layer 12 connected to the support parts 65 is not electrically connected to the other first conductor layers 12, a second conductor layer 22, a first electronic element 13, and a second electronic element 23 and does not fulfill an electrical function is adopted, it is useful with regard to allowing the first electronic element 13 and the second electronic element 23 to be prevented from exhibiting unexpected behavior due to conduction of the support parts 65.

The first head part 61 may have a substantially rectangular shape in a plane view. In this case, the support parts 65 may be provided to correspond to three sides of the first head part 61 (see FIG. 8).

Extending parts 75 may have plane-direction extending parts 176 (176a to 176c) extending from a second head part 71 in the plane direction and height-direction extending parts 175 (175a to 175c) extending from the plane-direction extending parts 176 in a height direction (a first direction). In addition, the support parts 65 may have plane-direction support parts 166 (166a to 166c) extending from the first head part 61 in the plane direction and height-direction support parts 165 (165*a* to 165*c*) extending from the plane-direction support parts 166 in the height direction (the first direction). It should be noted that the plane-direction support part 166 means a part of which a size in a width direction is smaller than that of the first head part 61.

Each of the plane-direction extending parts 176 and each of the plane-direction support parts 166 may not overlap with each other in a plane view. When such an aspect is adopted, it is useful with regard to allowing a size of an electronic module in the plane direction to be reduced.

In more detail, in an aspect shown in FIGS. 7 to 9, a first extending part 75*a*, a second extending part 75*b*, and a third extending part 75*b* are provided, and a first support part 65*a*, a second support part 65*b*, and a third support part 65*b* are provided. The first extending part 75*a* has a first plane-direction extending part 176*a* and a first height-direction extending part 175*a*, a second extending part 75*b* has a second plane-direction extending part 176*b* and a second height-direction extending part 175*b*, and a third extending part 75*c* has a third plane-direction extending part 176*c* and a third height-direction extending part 175*c*. The first support part 65*a* has a first plane-direction support part 166*a* and a first height-direction support part 165*a*, the second support part 65*b* has a second plane-direction support part 166*b* and a second height-direction support part 165*b*, and the third support part 65*c* has a third plane-direction support part 166*c* and a third height-direction support part 165*c*.

As shown in FIG. 8, a direction (a rightward direction in FIG. 8) in which the first plane-direction extending part 176*a* extends from the second head part 71 and the direction (a leftward direction in FIG. 8) in which the first plane-direction support part 166*a* extends from the first head part 61 are opposite to each other in a plane view. In addition, a direction (an upward direction in FIG. 8) in which the second plane-direction extending part 176*b* extends from the second head part 71 and a direction (the upward direction in FIG. 8) in which the third plane-direction support part 166*c* extends from the first head part 61 are the same as each other, but the second plane-direction extending part 176*b* and the third plane-direction support part 166*c* are disposed to deviate from each other in a third direction of the plane direction. In addition, a direction (a downward direction in FIG. 8) in which the third plane-direction extending part 176*c* extends from the second head part 71 and a direction (the downward direction in FIG. 8) in which the second plane-direction support part 166*b* extends from the first head part 61 are the same as each other, but the third plane-direction extending part 176*c* and the second plane-direction support part 166*b* are disposed to deviate from each other in the third direction of the plane direction.

In addition, as shown in FIG. 8, when an aspect in which the first electronic element 13 and the second electronic element 23 are disposed to deviate from each other in the plane direction and each of a first terminal such as a first gate terminal 13*g*, and a second terminal such as a second gate terminal 23*g*, is exposed from the second head part 71 in a plane view is adopted, it is useful with regard to allowing spaces for connecting connectors or wires to the first gate terminal 13*g* and the second gate terminal 23*g* to be secured. In addition, according to this aspect, it is useful with regard to allowing a process of connecting the connectors and the wires to the first gate terminal 13*g* and the second gate terminal 23*g* to be performed after the first connecting body 60 and a second connecting body 70 are mounted.

Further, since the support parts 65 have the plane-direction support parts 166, it is useful with regard to allowing the first electronic element 13 and the second electronic element 23 to be disposed to deviate from each other in the third direction in the plane direction, and allowing an overlapping area of heat generation between the first electronic element 13 and the second electronic element 23 to be reduced, as shown in FIG. 9.

By adopting an aspect in which three or more support parts 65 are provided, it is useful with regard to allowing higher stability and heat dissipation properties to be realized. However, the number of support parts 65 is not limited thereto, but four or more support parts 65 may be provided or only two support parts 65 may be used as shown in a fourth embodiment and a fifth embodiment to be described below.

It should be noted that even when an aspect in which the plane-direction support parts 166 are not provided by setting the number of support parts 65 to three or less is adopted, the first electronic element 13 and the second electronic element 23 can be disposed to deviate from each other in a plane view. As described above, by disposing the first electronic element 13 and the second electronic element 23 to deviate from each other, it is possible to suppress heat dissipation efficiency from being reduced due to overlapping of heat between the first electronic element 13 and the second electronic element 23.

Fourth Embodiment

Next, a fourth embodiment of the present invention will be described.

In the third embodiment, the aspect in which the three extending parts 75 are provided and three support parts 65 are provided is described, but in the present embodiment, two extending parts 75 are provided and two support parts 65 are provided. In other configurations, all the aspects described in the above respective embodiments can be adopted. The members described in the above respective embodiments will be described using the same reference numerals.

In the present embodiment, a first extending part 75*a* and a second extending part 75*b* are provided, and a first support part 65*a* and a second support part 65*b* are provided. The first extending part 75*a* has a first plane-direction extending part 176*a* and a first height-direction extending part 175*a*, and the second extending part 75*b* has a second plane-direction extending part 176*b* and a second height-direction extending part 175*b*. The first support part 65*a* has a first plane-direction support part 166*a* and a first height-direction support part 165*a*, and the second support part 65*b* has a second plane-direction support part 166*b* and a second height-direction support part 165*b*.

Figure 10:
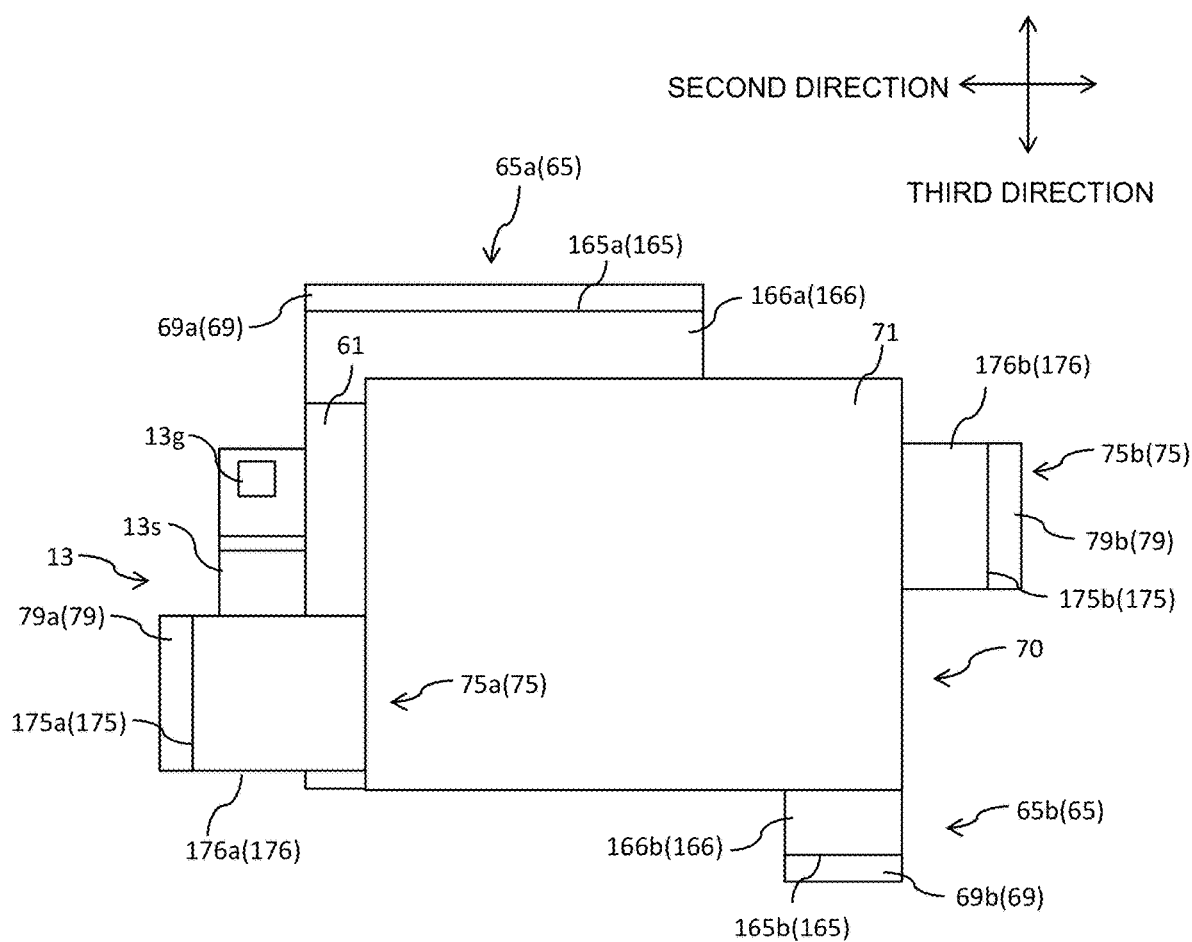
FIG. 10 is a plan view of an electronic module that can be used in a fourth embodiment of the present invention.

A direction in which the first plane-direction extending part 176*a* extends from a second head part 71 and a direction in which the second plane-direction extending part 176*b* extends from the second head part 71 (leftward and rightward directions (a second direction) of FIG. 10) and a direction in which the first plane-direction support part 166*a* extends from a first head part 61 and a direction in which the second plane-direction support part 166*b* extends from the first head part 61 (upward and downward directions (a third direction) of FIG. 10) are orthogonal to each other in a plane view.

When an aspect according to the present embodiment is adopted, it is useful with regard to allowing the extending parts 75 and the support parts 65 to be prevented from being hindered with each other while increasing widths of the extending parts 75 and widths of the support parts 65. By increasing the widths of the extending parts 75, it is useful with regard to allowing heat dissipation properties by the extending parts 75 to be improved, and allowing stability of the extending parts 75 to be improved. Similarly, by increasing the widths of the support parts 65, it is useful with regard to allowing heat dissipation properties by the support parts 65 to be improved, and allowing stability of the support parts 65 to be improved.

In addition, since the support parts 65 have plane-direction support parts 166, even though the widths of the extending parts 75 and the widths of the support parts 65 are increased, it is useful with regard to allowing a first electronic element 13 and a second electronic element 23 to be disposed to deviate from each other in a plane direction, and allowing an overlapping area of heat generation between the first electronic element 13 and the second electronic element 23 to be reduced.

Fifth Embodiment

Next, a fifth embodiment of the present invention will be described.

Figure 11:
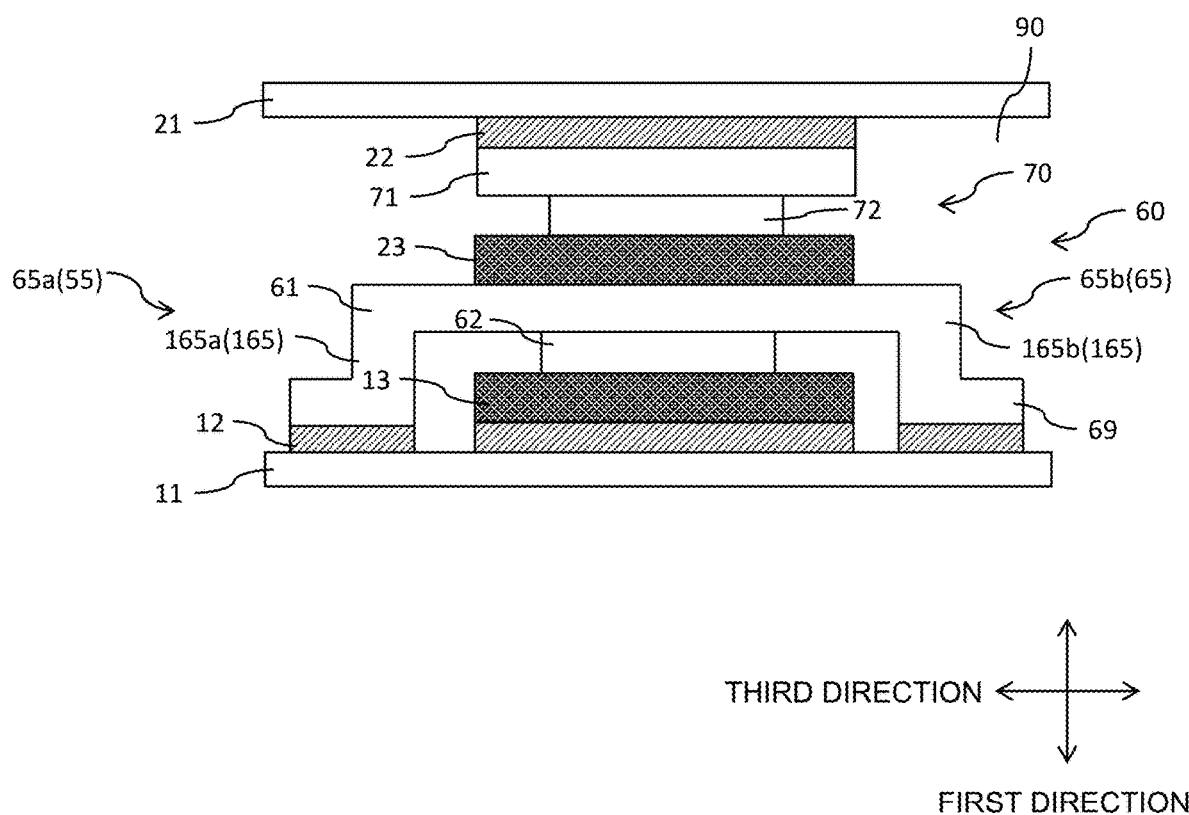
FIG. 11 is a longitudinal cross-sectional view of an electronic module that can be used in a fifth embodiment of the present invention.
Figure 12:
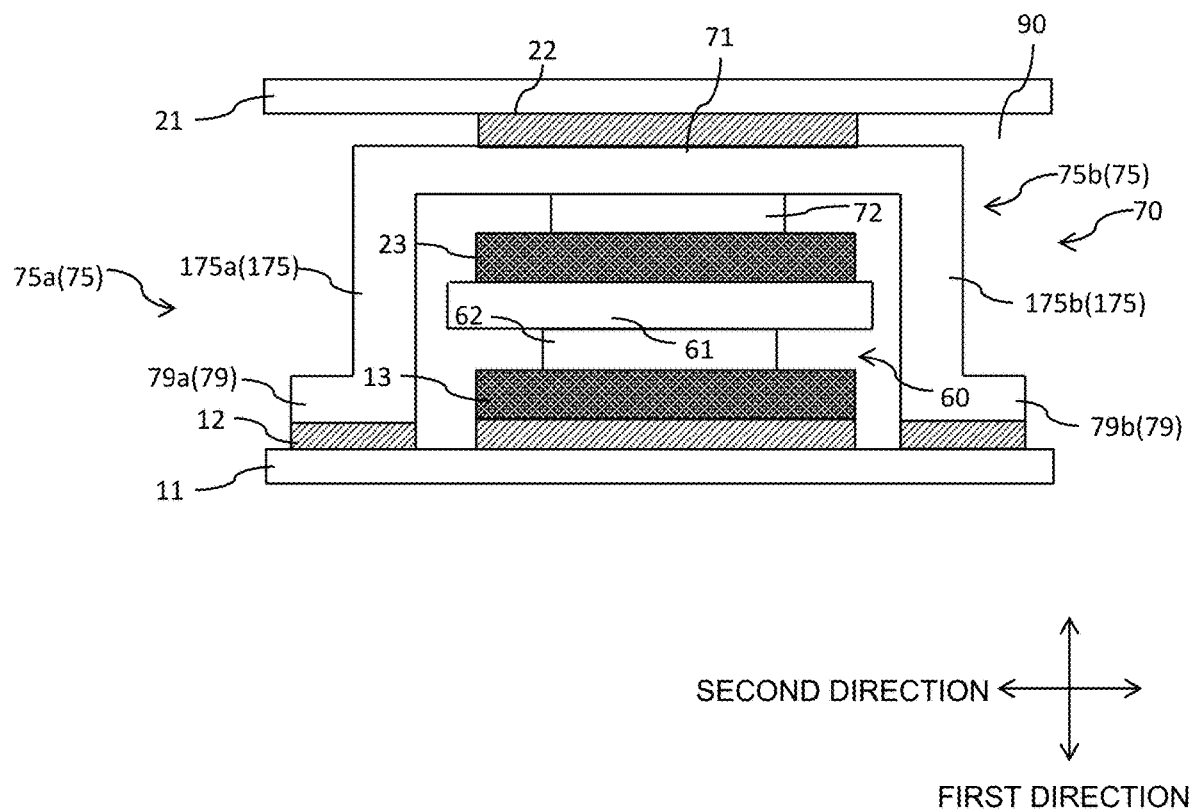
FIG. 12 is a longitudinal cross-sectional view of the electronic module that can be used in the fifth embodiment of the present invention, taken along a direction different from that of FIG. 11.

In the fourth embodiment, the aspect in which the first extending part 75a has the first plane-direction extending part 176a and the first height-direction extending part 175a, the second extending part 75b has the second plane-direction extending part 176b and the second height-direction extending part 175b, the first support part 65a has the first plane-direction support part 166a and the first height-direction support part 165a, and the second support part 65b has the second plane-direction support part 166b and the second height-direction support part 165b is described, but in the present embodiment, the first plane-direction extending part 176a, the second plane-direction extending part 176b, the first plane-direction support part 166a, and the second plane-direction support part 166b are not provided. Instead, a first extending part 75a has a first height-direction extending part 175a and a second extending part 75b has a second height-direction extending part 175b, as shown in FIG. 12, which is a longitudinal cross-sectional view taken along a second direction, and a first support part 65a has a first height-direction support part 165a and a second support part 65b has a second height-direction support part 165b, as shown in FIG. 11, which is a longitudinal cross-sectional view taken along a third direction. Other configurations are the same as those in the fourth embodiment. In addition, all the aspects described in the above respective embodiments can be adopted. The members described in the above respective embodiments will be described using the same reference numerals.

In the present embodiment, since the first plane-direction extending part 176a, the second plane-direction extending part 176b, the first plane-direction support part 166a, and the second plane-direction support part 166b are not provided, a size of an electronic module in a plane direction can be reduced.

It should be noted that the present invention is not limited to the aspects according to the fourth embodiment and the fifth embodiment, and the extending parts 75 may have plane-direction extending part 176, but the support parts 65 may not have plane-direction support parts 166. Conversely, the extending parts 75 may not have the plane-direction extending parts 176, but the support parts 65 may have the plane-direction support parts 166.

The description of the embodiments and the disclosure of the drawings described above are merely examples for explaining the invention described in the claims, and the invention described in the claims is not limited by the description of the embodiment or the disclosure of the drawings described above. In addition, the recitation of the claims at the original application is merely an example, and the recitation of the claims can be appropriately changed based on the description of the specification, the drawings, and the like.

REFERENCE SIGNS LIST

11 First substrate
12 First conductor layer
13 First electronic element
23 Second electronic element
60 First connecting body
61 First head part
65 Support part
70 Second connecting body
71 Second head part
75 Extending part
79 Extending base end part
165 Height-direction support part
166 Plane-direction support part
175 Height-direction extending part
176 Plane-direction extending part

The invention claimed is:

1. An electronic module comprising:
a first substrate;
three or more first conductor layers that are provided on one side of the first substrate;
a first electronic element that is provided on one side of one of the first conductor layers;
a second electronic element that is provided on one side of the first electronic element; and
a second connecting body that has a second head part provided on one side of the second electronic element, and three or more extending parts extending from the second head part to the other side and abutting against the three or more first conductor layers, wherein
the second connecting body has a second pillar part extending from the second head part to the other side, and the second pillar part is connected to the second electronic element, and
among the three or more first conductor layers connected by the three or more extending parts, at least two of the first conductor layers are not electrically connected to the other first conductor layer, the first electronic element, the second electronic element, and do not work electrically, and at least one of the first conductor layers works electrically.

2. The electronic module according to claim 1, wherein at least one of the extending parts has a plane-direction extending part extending from the second head part in a plane direction and a height-direction extending part extending from the plane-direction extending part to the other side.

3. The electronic module according to claim 1, wherein at least one of the extending parts has an extending base end part extending in a plane direction.

4. The electronic module according to claim 1, further comprising
a first connecting body that is provided on one side of the first electronic element and is provided on the other side of the second electronic element,
wherein the first connecting body has a first head part, on one side of which the second electronic element is provided, and a support part extending from the first head part to the other side and abutting against the first substrate or at least one of the first conductor layers.

5. The electronic module according to claim 4, wherein the first connecting body has a plurality of support parts.

6. The electronic module according to claim 4, wherein each of extending parts has a plane-direction extending part, each of support parts has a plane-direction support part, and the plane-direction extending part and the plane-direction support parts do not overlap with each other in a plane view.

7. An electronic module comprising:

three or more first substrates;

a first electronic element that is provided on one side of one of the first substrates;

a second electronic element that is provided on one side of the first electronic element; and a second connecting body that has a second head part provided on one side of the second electronic element, and three or more extending parts extending from the second head part to the other side and abutting against the three or more first substrates, wherein the first substrates are metal substrates, the second connecting body has a second pillar part extending from the second head part to the other side, and the second pillar part is connected to the second electronic element, and among the three or more first substrates connected by the three or more extending parts, at least two of the first substrates are not electrically connected to the other first substrate, the first electronic element, the second electronic element, and do not work electrically, and at least one of the first substrates works electrically.

\* \* \* \* \*